(12) United States Patent
Donkoh

(10) Patent No.: US 8,767,492 B2
(45) Date of Patent: Jul. 1, 2014

(54) METHODS AND SYSTEMS TO READ REGISTER FILES WITH UN-CLOCKED READ WORDLINES AND CLOCKED BITLINES, AND TO PRE-CHARGE A BITELINE TO A CONFIGURABLE VOLTAGE

(75) Inventor: Eric Kwesi Donkoh, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 56 days.

(21) Appl. No.: 12/776,264

(22) Filed: May 7, 2010

(65) Prior Publication Data
US 2011/0273945 A1 Nov. 10, 2011

(51) Int. Cl.
*G11C 7/00* (2006.01)

(52) U.S. Cl.
USPC .................. 365/203; 365/154; 365/230.03

(58) Field of Classification Search
USPC .................. 365/154, 230, 230.03, 203
See application file for complete search history.

(56) References Cited

U.S. PATENT DOCUMENTS

| 6,466,497 | B1 * | 10/2002 | Desai et al. | 365/203 |
| 7,187,606 | B1 * | 3/2007 | Goel | 365/203 |
| 7,668,035 | B2 * | 2/2010 | Chu et al. | 365/227 |
| 7,830,727 | B2 * | 11/2010 | Arsovski et al. | 365/189.15 |
| 2009/0251974 | A1 * | 10/2009 | Chu et al. | 365/189.02 |
| 2010/0165753 | A1 * | 7/2010 | Wijeratne et al. | 365/189.11 |
| 2011/0199850 | A1 * | 8/2011 | Yang | 365/226 |

* cited by examiner

*Primary Examiner* — Hoai V Ho
(74) *Attorney, Agent, or Firm* — Garrett IP, LLC

(57) ABSTRACT

A method and system to improve the operations of a memory device by reducing its bit line leakage, power consumption, and read access time. The memory device has a static read word line for each of its bit cells and domino logic for each of its bit line. Each bit line of the memory device is coupled with a gating logic that is activated using a clocked signal. This eases the timing requirement of the read word lines of the memory device and the read word lines do not form the critical path of the access time of the memory device. The leakage current of the memory device in inactive mode is reduced by switching off the pre-charge circuit and/or the keeper circuit of each bit line. Each bit line is pre-charged on demand prior to the evaluation of each bit line.

19 Claims, 9 Drawing Sheets

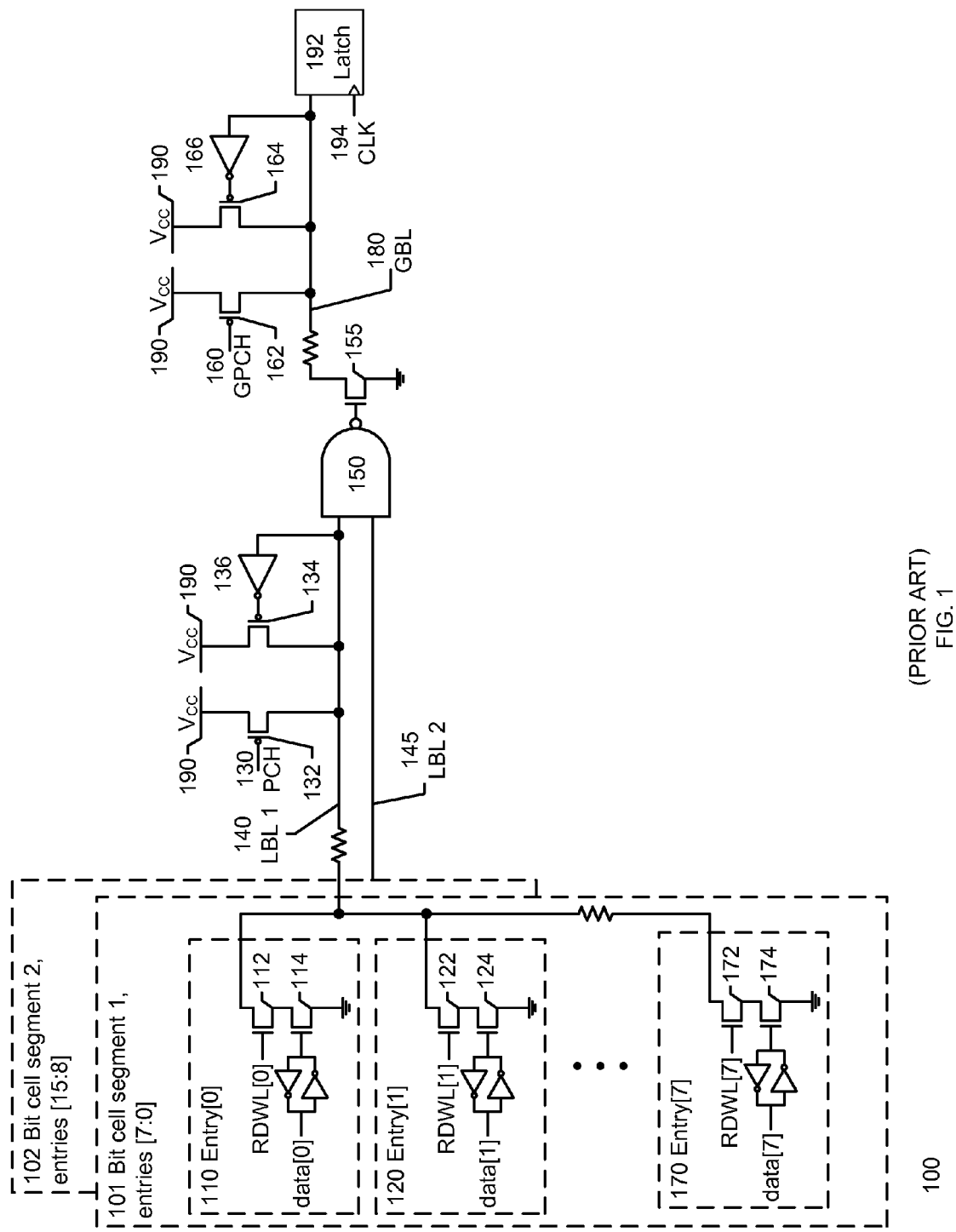
(PRIOR ART)
FIG. 1

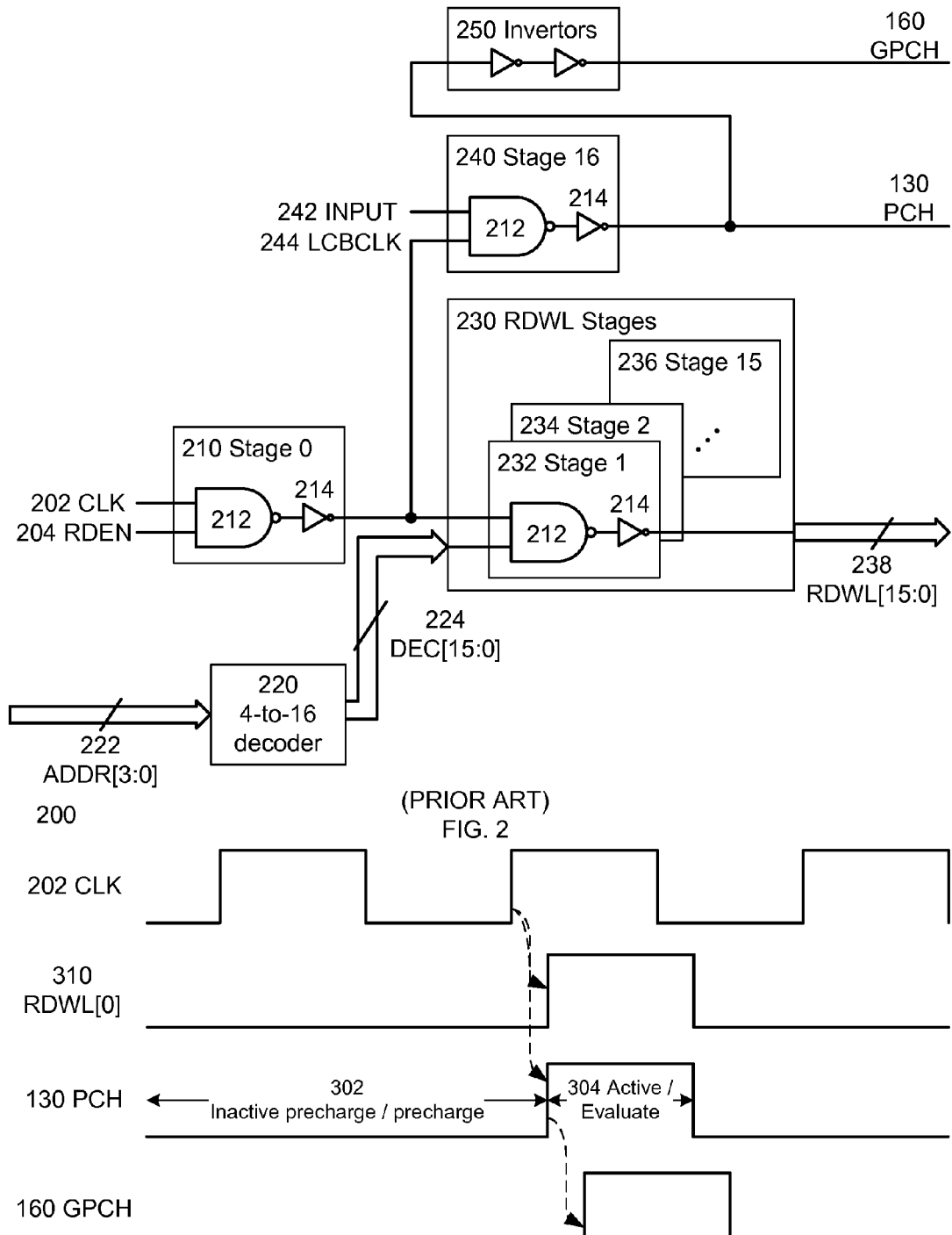
(PRIOR ART)
FIG. 2
(PRIOR ART)
FIG. 3

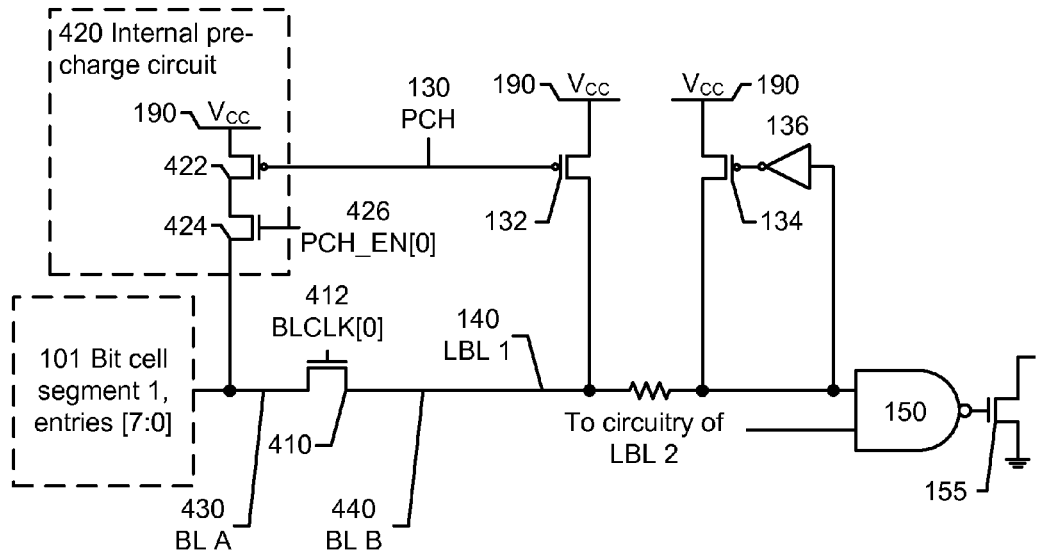
FIG. 4
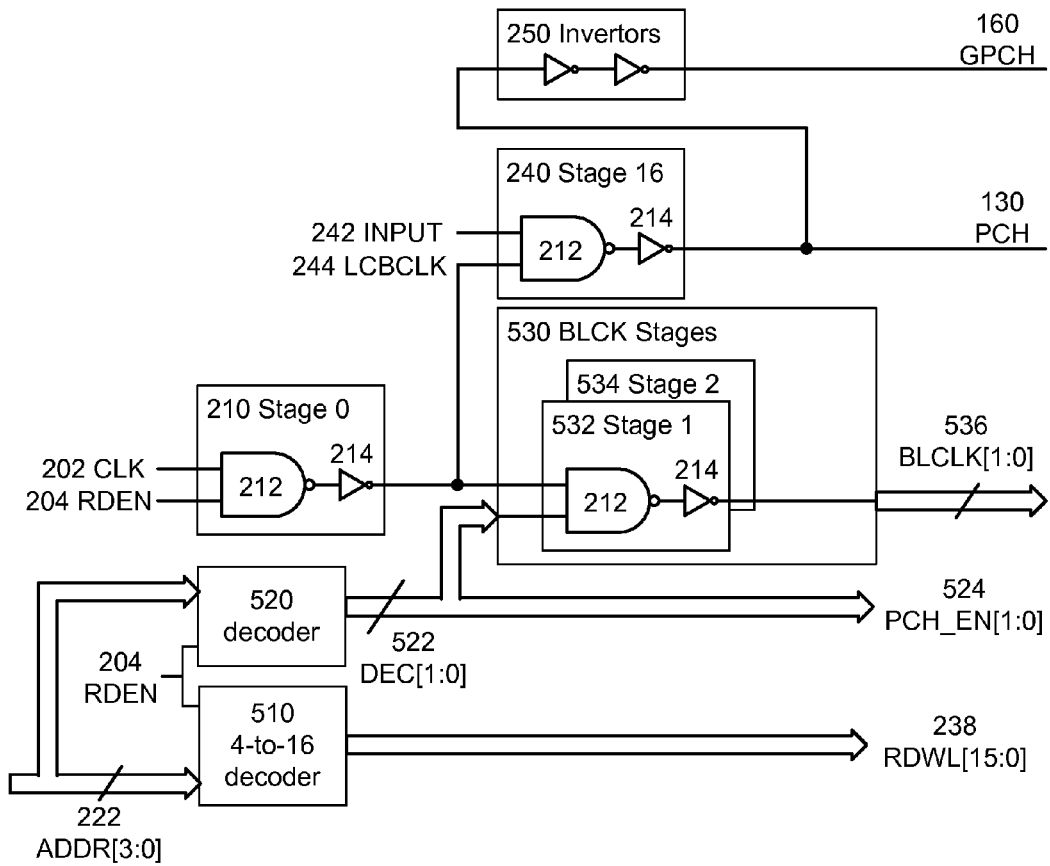
FIG. 5

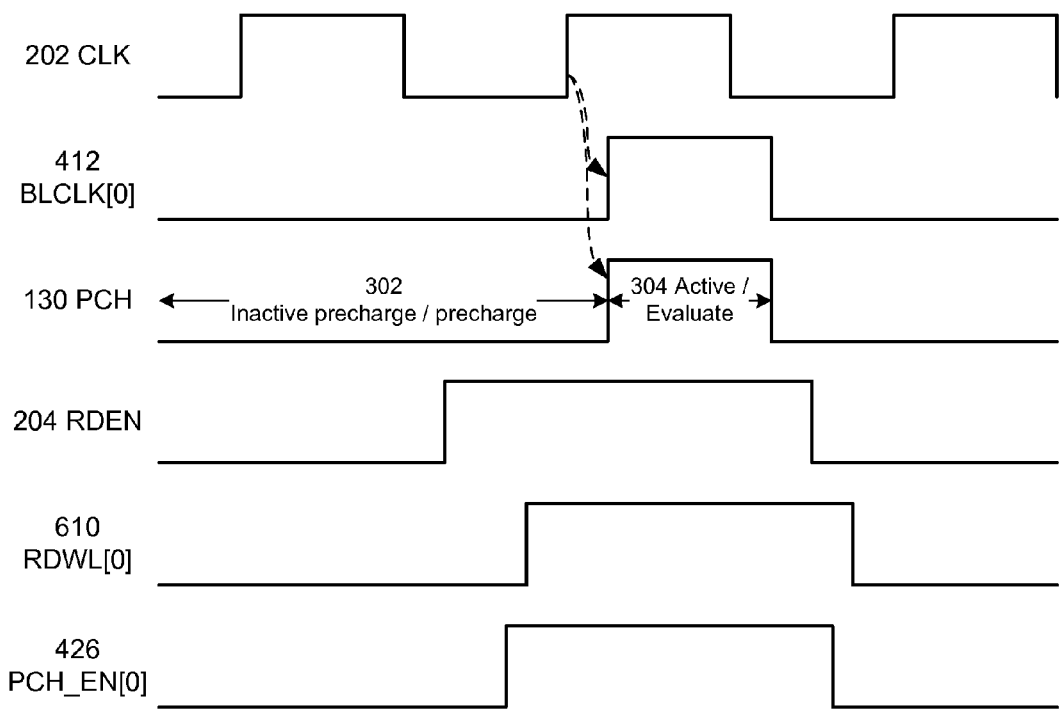
FIG. 6
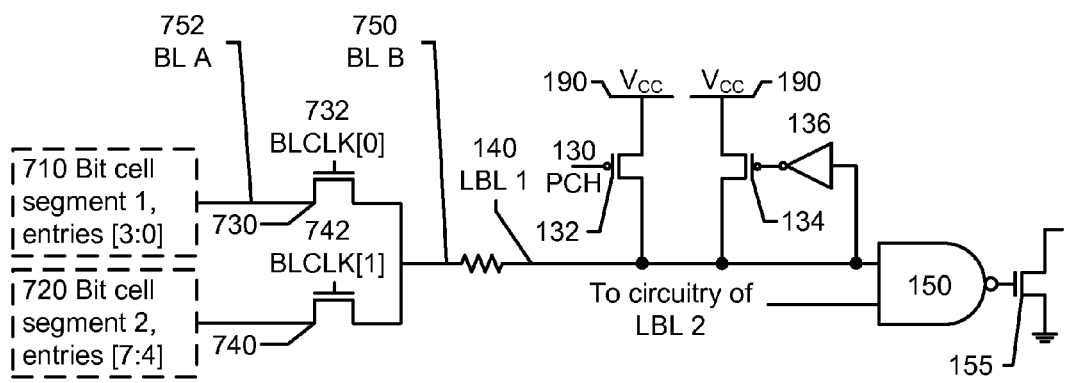
FIG. 7

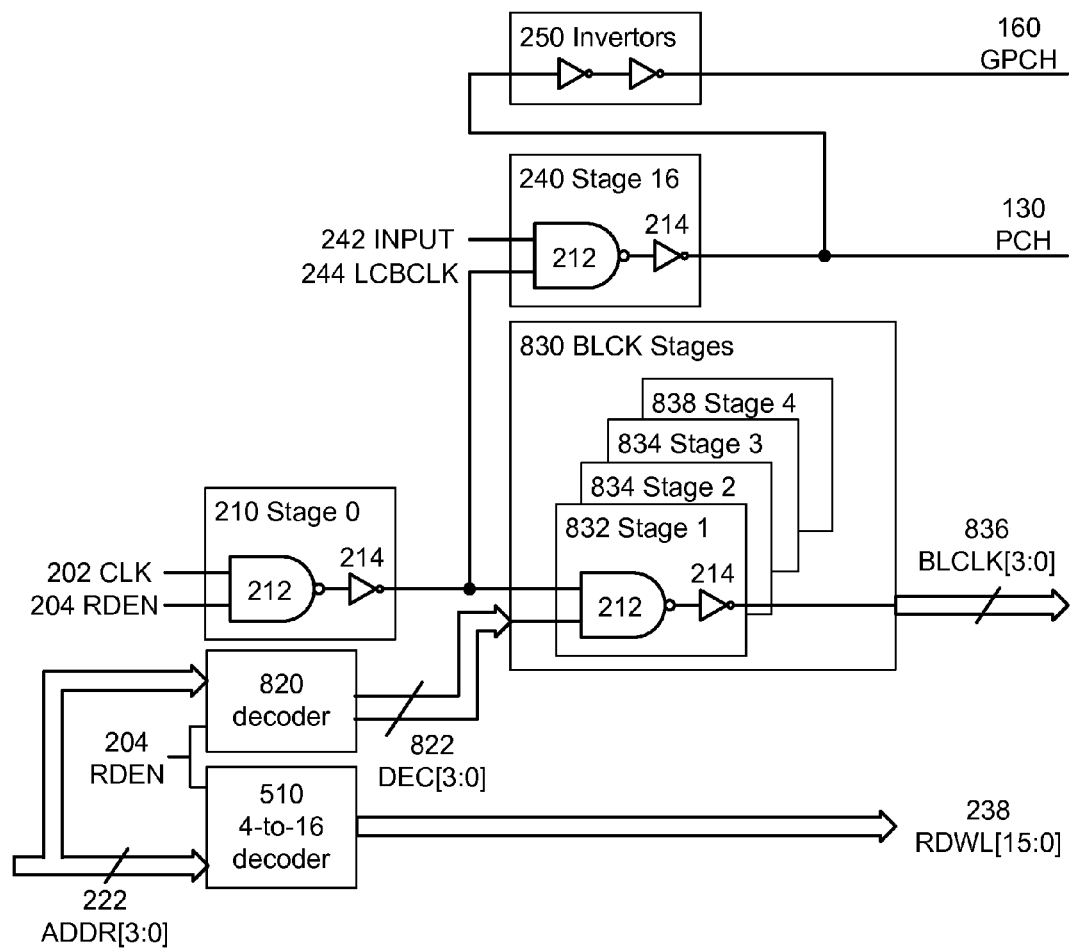
FIG. 8

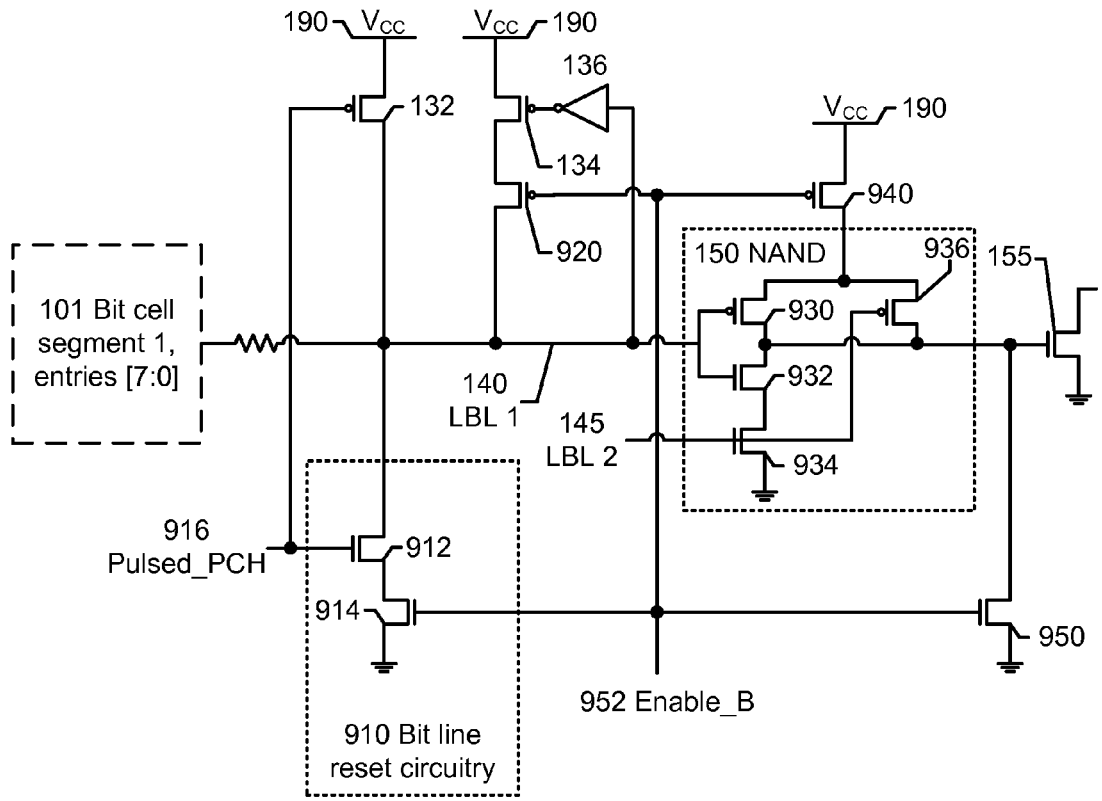
FIG. 9
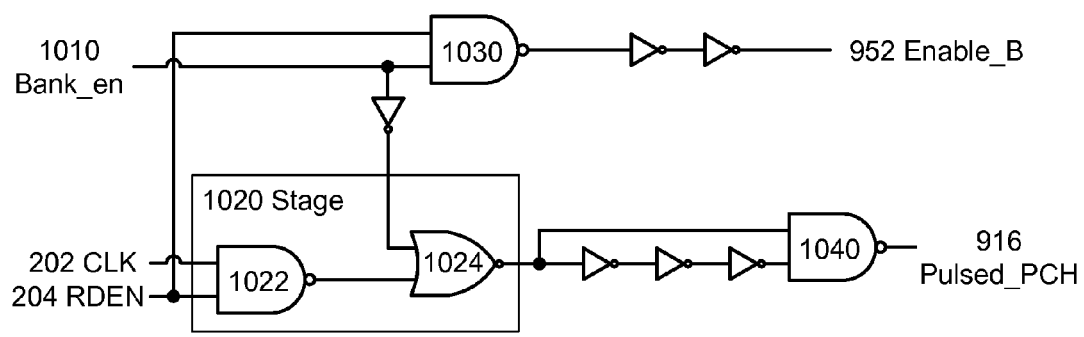
FIG. 10

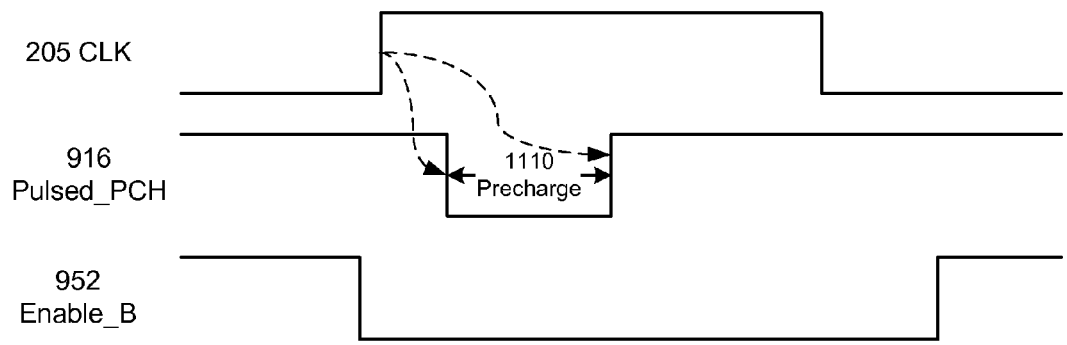
1100            FIG. 11
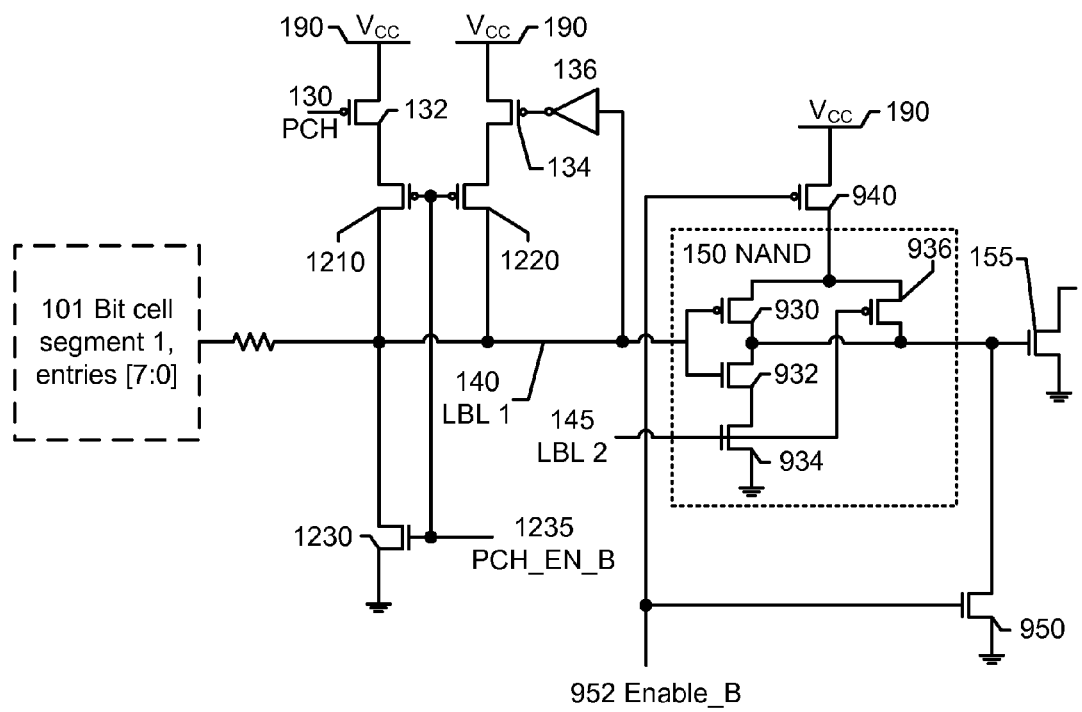
1200            FIG. 12

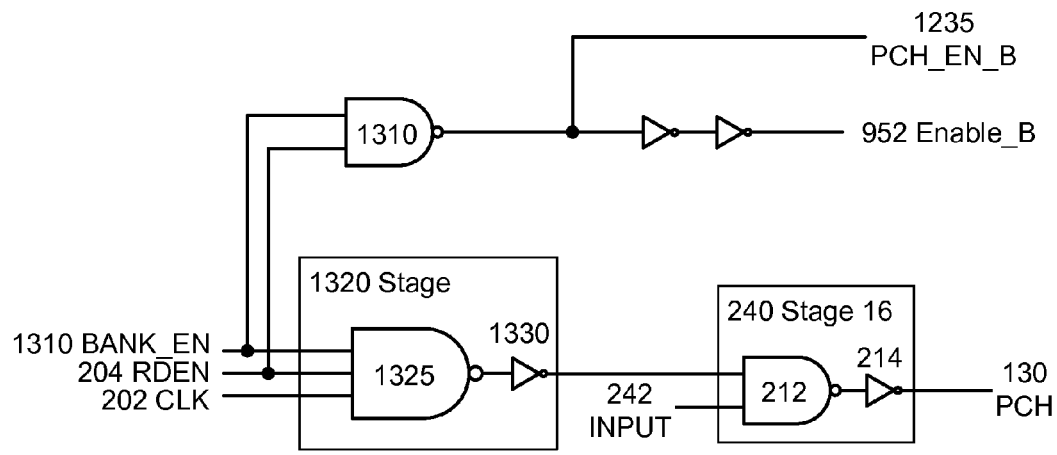
1300　　　　　　　　　　FIG. 13
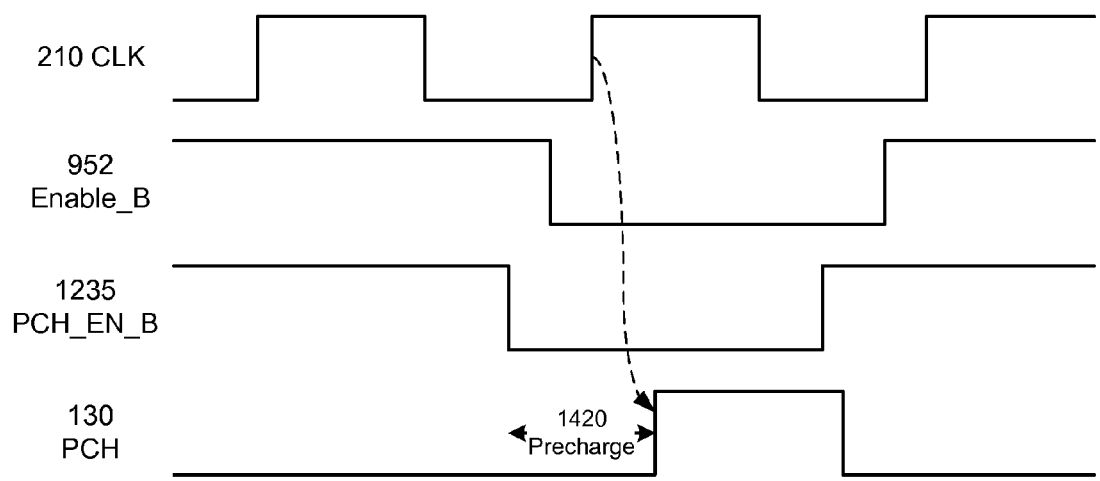
1400　　　　　　　　　　FIG. 14

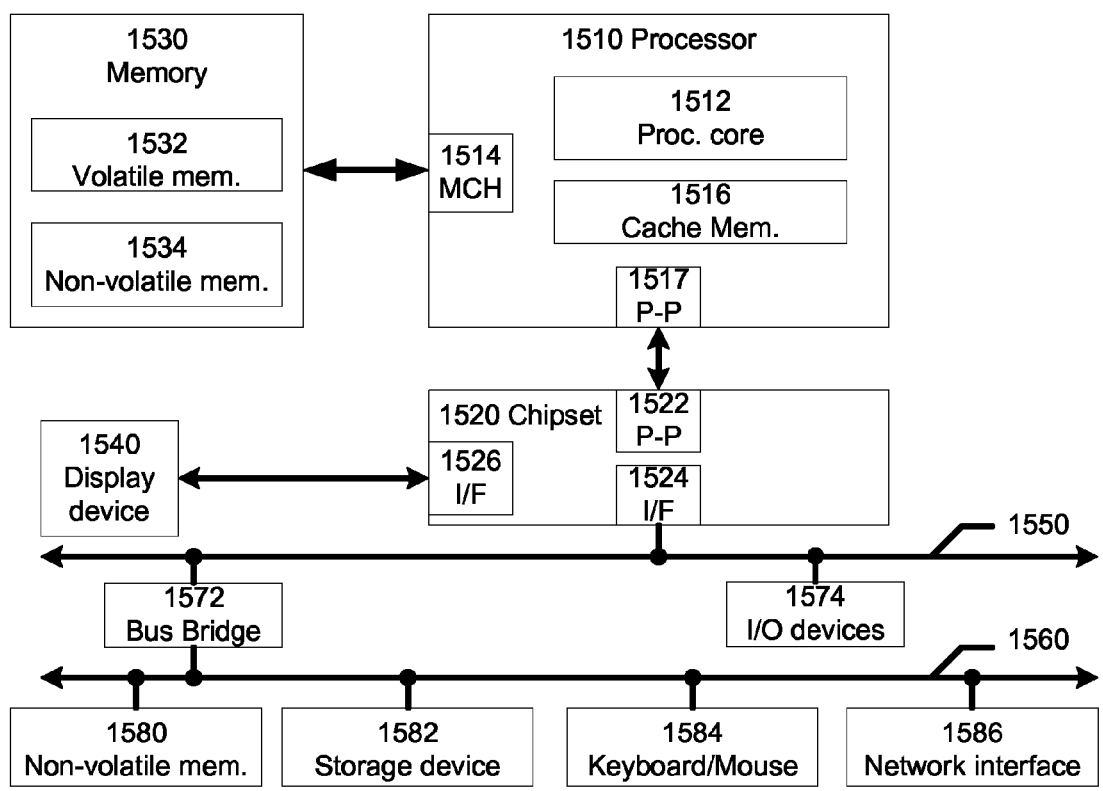
FIG. 15

US 8,767,492 B2

METHODS AND SYSTEMS TO READ REGISTER FILES WITH UN-CLOCKED READ WORDLINES AND CLOCKED BITLINES, AND TO PRE-CHARGE A BITELINE TO A CONFIGURABLE VOLTAGE

FIELD OF THE INVENTION

This invention relates to a memory device, and more specifically but not exclusively, to a method and system to improve the operations of the memory device by reducing its bit line leakage, power consumption, and read access time.

BACKGROUND DESCRIPTION

Memory devices such as register files are used in high performance microprocessors to store data due to their relatively fast access, ease of design and area efficiency. A register file is usually organized by bits and entries and FIG. 1 illustrates a prior art register file 100 with sixteen entries.

The prior art register file 100 has two segments of eight entries as illustrated by the bit cell segment 1 101 with entries [7:0] and the bit cell segment 2 102 with entries [15:8]. The bit cell segment 1 101 is connected with the local bit line 1 140, the pre-charge device or transistor 132 and a keeper device or transistor 134. The bit cell segment 2 102 is connected with the local bit line 2 145 and another pre-charge and keeper transistors (not shown).

The bit cell segment 1 101 has eight entries connected in parallel to the local bit line 1 140 to form a 8:1 multiplexer and is merged with the other eight entries in the bit cell segment 2 102 using the NAND gate 150 to form a 16:1 multiplexer. The 16:1 multiplexer is connected to the global bit line 180. The domino implementation in the prior art register file 100 requires the bit lines 140, 145 and 180 to be pre-charged to a supply voltage when the bit lines 140, 145 and 180 are inactive or not being accessed. Each entry in the bit line segments 101 and 102 is a source of leakage current when the bit lines 140, 145 and 180 are pre-charged to the supply voltage.

FIG. 2 illustrates a prior art clocking circuit 200 for the prior art register file 100. Each read word line for each entry in the bit cell segments 101 and 102 is clocked to create a clocked domino. The address signals (ADDR[3:0]) 222 are decoded to activate one of the read word lines (RDWL[15:0]) 238. Each read word line is connected with a respective delay stage in the RDWL delay stages 230. The prior art clocking circuit 200 creates clock distribution requirements and constraints in the prior art register file 100. The main clock (CLK) 202 has to be distributed to all the sixteen stages in the RDWL delay stages 230 and it may cause routing congestion, grid clock loading, and power dissipation.

Each delay stage slows the read access time of each entry by two gate delays due to the NAND gate 212 and the inverter 214. FIG. 3 illustrates a prior art timing diagram 300 of the prior art clocking circuit 200. The prior art clocking circuit 200 requires clock shielding to reduce the noise on the read word lines. The rising edge of the RDWL[0] 310 occurs after the rising edge of the main clock 202 due to the gate delays in the delay stage 1 232.

BRIEF DESCRIPTION OF THE DRAWINGS

The features and advantages of embodiments of the invention will become apparent from the following detailed description of the subject matter in which:

FIG. 1 illustrates a prior art register file with sixteen entries;

FIG. 2 illustrates a prior art clocking circuit for the prior art register file;

FIG. 3 illustrates a prior art timing diagram of the prior art clocking circuit;

FIG. 4 illustrates a register file in accordance with one embodiment of the invention;

FIG. 5 illustrates a clocking circuit for a register file in accordance with one embodiment of the invention;

FIG. 6 illustrates a timing diagram of a clocking circuit in accordance with one embodiment of the invention;

FIG. 7 illustrates a register file in accordance with one embodiment of the invention;

FIG. 8 illustrates a clocking circuit for a register file in accordance with one embodiment of the invention;

FIG. 9 illustrates a register file in accordance with one embodiment of the invention;

FIG. 10 illustrates a clocking circuit for a register file in accordance with one embodiment of the invention;

FIG. 11 illustrates a timing diagram of a clocking circuit in accordance with one embodiment of the invention;

FIG. 12 illustrates a register file in accordance with one embodiment of the invention;

FIG. 13 illustrates a clocking circuit for a register file in accordance with one embodiment of the invention;

FIG. 14 illustrates a timing diagram of a clocking circuit in accordance with one embodiment of the invention; and FIG. 15 illustrates a system to implement the methods disclosed herein in accordance with one embodiment of the invention.

DETAILED DESCRIPTION

Embodiments of the invention described herein are illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference numerals have been repeated among the figures to indicate corresponding or analogous elements. Reference in the specification to "one embodiment" or "an embodiment" of the invention means that a particular feature, structure, or characteristic described in connection with the embodiment is included in at least one embodiment of the invention. Thus, the appearances of the phrase "in one embodiment" in various places throughout the specification are not necessarily all referring to the same embodiment.

Embodiments of the invention provide a method and system to improve the operations of a memory device by reducing its bit line leakage, power consumption, and read access time. The memory device includes, but is not limited to, a register file, a static random access memories (SRAM), dynamic RAM (DRAM), read only memories (ROM), and the like.

In one embodiment of the invention, the memory device has a static read word line for each of its bit cells and domino logic for each of its bit line. Each bit line of the memory device is coupled with a gating logic that is activated using a clocked signal. By doing so, it eases the timing requirement of the read word lines of the memory device and the read word lines do not form the critical path of the access time of the memory device. In another embodiment of the invention, the leakage current of the memory device in inactive mode is reduced by switching off the pre-charge circuit and/or the keeper circuit of each bit line. Each bit line is pre-charged on demand prior to the evaluation of each bit line. By doing so, the leakage of the memory device in inactive mode can be reduced to minimize power consumption.

FIG. 4 illustrates a register file 400 in accordance with one embodiment of the invention. For clarity of illustration, FIG. 4 is discussed with reference to FIG. 1. The register file 400 uses a static or un-clocked read word line for each entry in each bit line segment in one embodiment of the invention. This allows the register file 400 to reduce the clock loading on the read word lines while maintaining the performance advantage and area efficiency of a domino by implementing every bit line as a domino.

The register file 400 has sixteen entries that are divided into the bit cell segment 1 101 and bit cell segment 2 102 (not shown). The bit cell segment 1 101 has the first eight entries [7:0] and its structure is illustrated in FIG. 1. The pass transistor 410 is inserted on the local bit line 1 (LBL1) 140 to form the bit line A (BL A) 430 and the bit line B (BL B) 440. The BL A 430 is coupled with the bit cell segment 1 101 and the BL B 440 is coupled with the LBL1 140.

The pass transistor 410 acts like a gating logic between the bit cell segment 1 101 and the LBL 1 140 in one embodiment of the invention. In another embodiment of the invention, the pass transistor 410 multiplexes or connects more than one bit line segment to the LBL 1 140. The bit line clock 0 (BLCLK [0]) signal 412 enables or activates the pass transistor 410 to allow access of the entries in the bit cell segment 1 101. In one embodiment of the invention, the BLCLK[0] signal 412 is generated based on the decoded address signals of the register file 400 and is clocked, i.e., sent in synchronization with a clock.

By clocking the BLCLK[0] signal 412 of the pass transistor 410, each read word line of each entry in the bit cell segment 1 101 does not need to be clocked. The domino clocking requirements of the read word lines is shifted to the BLCLK[0] signal 412 and the register file 400 has a similar domino functionality without clocking read word lines. As the pass transistor 410 is shared by multiple entries in the bit cell segment 1 101, the number of required clocked signals is reduced. For example, in one embodiment of the invention, the number of clock signals required for the register file 400 is only two, i.e., the BLCLK[0] signal 412 of the pass transistor 410 and a BLCLK[1] signal of another pass transistor in the LBL 2 145 (not shown). As compared to the sixteen clocked read word lines in the prior art register file 100, the register file 400 reduces the number of clocked signals by a factor of eight. This significantly reduces the clock loading on the clock network in the register file 400 in one embodiment of the invention.

In one embodiment of the invention, the register file 400 has a pre-charge circuit to hold or keep the LBL 1 140 at a power supply voltage $V_{CC}$ 190 when the LBL 1 140 is not active or being evaluated. In one embodiment of the invention, the pre-charge circuit is implemented using the pre-charge device or transistor 132 that is connected with $V_{CC}$ 190 and the LBL 1 140. The pre-charge transistor 132 holds the LBL 1 140 at $V_{CC}$ 190 to prevent the LBL 1 140 from enabling the NAND gate 150 to set a logic one to the transistor 155 when the LBL 1 140 is not active. The pre-charge transistor 132 is controlled by the pre-charge (PCH) signal 130. The NAND gate 150 is connected with the transistor 155 and the rest of the circuitry connected to the global bit line (GBL) 180 (not shown). In one embodiment of the invention, the register file 400 has a keeper circuit to maintain the voltage of the LBL 1 140 when a particular entry of the bit cell segment 1 101 stores a logic zero. In one embodiment of the invention, the keeper circuit is implemented with a keeper transistor 134 and an inverter 136.

In one embodiment of the invention, charge sharing between the BL A 430 and the BL B 440 may occur when the pass transistor 410 is enabled. The charge sharing occurs when the BL B 440 is at $V_{CC}$ 190 and the BL A 430 is at ground voltage. The BL A 430 may be discharged to ground voltage due to leakage through the entries in the bit cell segment 1 101 or due to a logic one stored in the particular entry that is to be accessed. For example, in one embodiment of the invention, when the LBL 1 140 is in a non-active or non-evaluation phase, the pre-charge transistor 132 is enabled and it holds the LBL 1 140 and BL B 440 at $V_{CC}$ 190. Assuming that the entry[0] 110 of the bit cell segment 1 101 is to be read and it stores a data value of logic zero, the RdWL[0] signal of entry[0] 110 enables the transistor 112.

If BL A 430 was discharged to ground voltage from a previous read or through leakage, then when the BLCLK[0] signal 412 is set to logic one to enable the pass transistor 410 during the evaluation phase of the LBL 1 140, there may be some charge sharing from the BL B 440 to the BL A 430. The charge sharing is due to the voltage difference between the BL A 430 and the BL B 440 that may affect the reading of the entries of the bit cell segment 101. The noise on the LBL 1 140 due to the charge sharing is a function of the capacitance ratio of the BL A 430 and the BL B 440 and the difference in their voltage level. The keeper transistor 134 on the BL B 440 can recover from the impact of a reasonable level of charge sharing in one embodiment of the invention.

To minimize the charge sharing from the BL B 440 to the BL A 430, an internal pre-charge circuit 420 is added to the register file 400 in one embodiment of the invention. The requirement of the internal pre-charge circuit 420 is optional and it depends on the severity of the effect of the charging sharing between the BL A 430 and the BL B 440 in one embodiment of the invention.

The internal pre-charge circuit 420 has a pre-charge transistor 422 and an enable transistor 424 that are controlled by the PCH signal 130 and the pre-charge enable 0 (PCH_EN [0]) signal 426. The PCH_EN[0] signal 426 is asserted or activated for a specific amount of time to pre-charge the BL A 430 to a voltage level of $V_{CC}$-$V_T$ before the PCH signal 130 is de-activated to turn off pre-charging of both BL A 430 and BL B 440. The voltage $V_T$ is the threshold voltage of the enable transistor 424.

With the internal pre-charge circuit 420, the voltage difference between the BL A 430 and the BL B 440 is reduced from $V_{CC}$ to $V_T$ when the pass transistor 410 is enabled. The magnitude of the charge sharing between the BL A 430 and the BL B 440 is reduced as their voltage difference is smaller. In one embodiment of the invention, the PCH_EN[0] signal 426 is asserted for two gate delays before the PCH signal 130 deactivates the pre-charging of BL A 430 and BL B 440. In another embodiment of the invention, a different number of gate delays is set. One of ordinary skill in the relevant art will readily appreciate how to determine a suitable number of gate delays based on the desired reduction of charge sharing noise. In one embodiment of the invention, the NAND gate 150 attenuates the noise due to the charge sharing on the BL B 440.

The implementation of the pre-charge circuit and the keeper circuit illustrated in FIG. 4 is not meant to be limiting. One of ordinary skill in the relevant will readily appreciate that other pre-charge and keeper circuits can be used without affecting the workings of the invention. The circuitry associated with the LBL 2 145 is similar to the circuitry associated with LBL 1 140 and is not shown in FIG. 4 for clarity of illustration. One of ordinary skill in the relevant art will readily appreciate how to implement the circuitry associated with the LBL 2 145 and it shall not be described herein.

FIG. 5 illustrates a clocking circuit 500 for the register file 400 in accordance with one embodiment of the invention. For clarity of illustration, FIG. 5 is discussed with reference to FIGS. 1 and 4. The clocking circuit 500 illustrates the clocking scheme that is required by the register file 400 in one embodiment of the invention.

The clocking circuit 500 has a main clock 202 and a read enable (RDEN) signal 204. The RDEN signal 204 is activated when the register file 400 is in a read mode or operation. The main clock 202 and the RDEN signal 204 are connected to a delay stage 0 210 that has a NAND gate 212 and an inverter 214. A local bit clock (LCBCLK) 244 is generated after the delay stage 0 210.

The clocking circuit 500 has four address signals (ADDR [3:0]) 222 to select one of the sixteen entries of the register file 400. The ADDR[3:0] signals 222 are connected to a 4-to-16 decoder 510 and a decoder 520. The 4-to-16 decoder 510 decodes the ADDR[3:0] signals 222 to set or enable one of the RDWL[15:0] signals 238. The RDWL[15:0] signals 238 are gated by the RDEN signal 204 to ensure that all the bits of the RDWL[15:0] signals 238 are driven to logic zero when they are not being accessed. When all the RDWL[15:0] signals 238 are set at logic zero, the pull-down transistor in each entry is disabled to conserve power. For example, in one embodiment of the invention, when the RDWL[0] signal in the entry 110 is set to logic zero, the transistor 112 is disabled and it disconnects the path to the ground node.

The decoder 520 decodes the ADDR[3:0] signals 222 to determine which of the bit cell segments 101 or 102 should be activated. The decoder 520 is also gated or controlled by the RDEN signal 204. When the decoding is complete, the decoder 520 sets the decoder outputs (DEC[1:0]) 522. In one embodiment of the invention, the DEC[1:0] signals 522 are used to set the PCH_EN[1:0] signals 524. The PCH_EN[0] signal 426 and the PCH_EN[1] signal activates the internal pre-charge circuit of the bit cell segment 1 101 and the bit cell segment 2 102 respectively.

The DEC[1:0] signals 522 is connected to the BLCLK stages 530 that has a delay stage 1 532 and a delay stage 2 534. The BLCLK stages 530 synchronizes the DEC[1:0] signals 522 with the LCBCLK 244 to generate the clocked BLCLK [1:0] signals 536. The BLCLK[0] signal and the BLCLK[1] signal activate the pass transistors of the LBL 1 140 and the LBL 2 145 respectively.

The LCBCLK 244 and an input signal 242 are connected with the delay stage 16 240 to generate the PCH signal 130. The input signal 242 is generated based on the ADDR[3:0] signals and/or the RDEN signal 204 in one embodiment of the invention. The PCH signal 130 is fed into the inverters 250 to generate the global pre-charge (GPCH) 160 signal.

The clocking circuit 500 illustrates that only two clock signals, i.e., the BLCLK[1:0] signals 536 are required. As compared to the prior-art clocking circuit 200, the removal of the RDWL delay stages 230 from the RDWL[15:0] signals 238 in the clocking circuit 500 speeds up the read access time of the register file 400.

FIG. 6 illustrates a timing diagram 600 of the clocking circuit 500 in accordance with one embodiment of the invention. The timing diagram 600 illustrates the read operation of the register file 400 and the clocking circuit 500. For clarity of invention, FIG. 6 is discussed with reference to FIGS. 4 and 5 and the entry[0] 110 of the bit cell segment 1 101 is assumed to be selected for reading and to store a data value of logic one.

When the register file 400 is in a read mode, the RDEN signal 204 is asserted from logic zero to logic one. When the entry[0] 110 of the bit cell segment 1 101 is selected for reading, the RDWL[0] signal 610 of the entry[0] 110 is asserted from logic zero to logic one and it is not required to be clocked. The RDWL[0] signal 610 can be asserted earlier than the BLCLK[0] 412 due to the absence of the RDWL delay stages 230. Since the entry[0] 110 is assumed to store a data value of logic one and the RDWL[0] signal 610 is asserted to logic one, the transistors 112 and 114 are enabled and the entry[0] 110 starts discharging the BL A 430 to ground voltage.

The PCH_EN[0] signal 426 is asserted to logic one to enable the internal pre-charge circuit 420 before the PCH signal 130 is asserted to logic one to disable the pre-charging of the LBL 1 140. This is illustrated in the timing diagram 600 where the rising edge of the PCH_EN[0] signal 426 is asserted before the rising edge of the PCH signal 130.

When the BLCLK[0] signal 412 is asserted to logic one, the reading of the entry[0] 110 begins. The evaluation of the entry[0] 110 is faster because the BL A 430 has been partially or fully discharged when the RDWL[0] signal 610 of the entry[0] 110 is asserted to logic one prior to the assertion of the BLCLK[0] signal 412. Since the internal pre-charge circuit 420 charges the BL A 430 to $V_{CC}$-$V_T$ instead of $V_{CC}$ 190, the BL A 430 requires lesser time to discharge as its initial voltage level is lower. As such, the register file 400 has an improved reading access time and lower clock loading compared to the prior-art register file 100 in one embodiment of the invention. The register file 400 requires a smaller area as it does not require the RDWL stages 230. The clock shielding requirements of the register file 400 is also minimized in one embodiment of the invention.

FIG. 7 illustrates a register file 700 in accordance with one embodiment of the invention. The register file 700 illustrates an implementation where the bit cells are separated into four bit cell segments having four bit cells. The LBL 1 140 is connected with the bit cell segment 1 710 that has entries[3:0] and the bit cell segment 2 720 that has entries[7:4]. The LBL 2 140 is also connected with another two bit cell segments for the entries[11:8] and the entries[15:12] but are not shown in FIG. 7 for clarity of illustration.

In one embodiment of the invention, the bit cell segment 0 710 is connected with the pass transistor 730 and the LBL 1 140. Similarly, the bit cell segment 1 720 is connected with the pass transistor 740 and the LBL 1 140. The pass transistors 730 and 740 are controlled by the BLCLK[0] signal 732 and BLCLK[1] signal 742 respectively. In one embodiment of the invention, the bit line loading of BL A 752 in the register file 700 is lower than the bit line loading of BL A 430 in the register file 400. This is due to the smaller number of bit cells supported by each pass transistor in the register file 700.

As compared to the sixteen clocked read word lines in the prior art register file 100, the register file 700 reduces the number of clocked signals by a factor of four as only four clocked BLCLK signals are required, i.e., the BLCLK[3:0] signals to control each of the four bit cell segments. This significantly reduces the loading on the clock network in the register file 700. The workings of the register file 700 are similar to the workings of the register file 400 and shall not be described herein. In one embodiment of the invention, the internal pre-charge circuit 420 is added to the register file 700 to minimize the charge sharing in the register file 700. One of ordinary skill in the relevant art will appreciate how to modify the circuitry of the register file 700 to include the internal pre-charge circuit 420.

FIG. 8 illustrates a clocking circuit 800 for the register file 700 in accordance with one embodiment of the invention. For clarity of illustration, FIG. 8 is discussed with reference to FIG. 7. The clocking circuit 800 illustrates the clocking scheme that is required by the register file 700 in one embodiment of the invention. The decoder 820 decodes the ADDR [3:0] signals 222 to determine which of the four bit cell segments should be activated. When the decoding is complete, the decoder 820 sets the decoder output (DEC[3:0]) signals 822.

The DEC[3:0] signals 822 are connected to the BLCLK stages 830 that has four delay stages for each of the BLCLK [3:0] signals 836. The BLCLK stages 830 synchronizes the DEC[3:0] signals 822 with the LCBCLK 244 to generate the clocked BLCLK[3:0] signals 836. The workings of clocking circuit 800 are similar to the workings of the clocking circuit 500 and one of ordinary skill in the relevant art will readily appreciate how it works.

FIG. 9 illustrates a register file 900 in accordance with one embodiment of the invention. The register file 900 has an optional bit line reset circuitry 910 and uses a pulsed pre-charge (Pulsed_PCH) signal 916 to pre-charge the LBL 1 140 prior to any read access operation. In one embodiment of the invention, the bit line reset circuitry 910 has transistors 912 and 914 that are connected with the LBL 1 140. The transistor 920 is inserted between the keeper transistor 134 and the LBL 1 140 in one embodiment of the invention. The transistor 920 is used to speed up the reset time and reduce the reset discharge contention in one embodiment of the invention.

When the register file 900 is in inactive or non-evaluation mode, the Pulsed_PCH signal 916 and the Enable_B signal 952 are asserted to logic one to enable the transistors 912 and 914 respectively. When the transistors 912 and 914 are enabled, the LBL 1 140 is discharged to ground voltage via the transistors 912 and 914. By discharging the LBL 1 140 to ground voltage, it reduces the leakage current of the entries in the bit cell segment 1 101. Although the LBL 1 140 may eventually discharge to ground voltage due to leakage after some time, the bit line reset circuitry 910 facilitates the voltage discharge of the LBL 1 140.

The pre-charge transistor 132 is disabled when the Pulsed_PCH signal 916 is set at logic one. When the Enable_B signal 952 is asserted to logic one, the transistor 920 is disabled and it blocks the connection of the keeper transistor 134 to the LBL 1 140. The keeper transistor 134 is also disabled as the LBL 1 140 is set to logic zero.

In one embodiment of the invention, the inactive leakage current of the register file 900 is reduced to the leakage current of the pre-charge transistor 132 and the keeper transistor 134. The entries in the bit cell segment 1 101 are no longer a source of leakage current as the LBL 1 140 is discharged to ground voltage. The reduction of leakage sources in the register file 900 drastically reduces the inactive leakage in one embodiment of the invention.

When the LBL 1 140 is discharged to ground voltage during the inactive mode of the register file 900, it causes the NAND gate 150 to generate a logic one to the GBL 180. This is a false activation of the GBL 180 as the LBL 1 140 is not being evaluated. To prevent the false activation of the GBL 180, the reset transistor 950 is connected to the output of the NAND gate 150. When the Enable_B signal 952 is asserted to logic one, the reset transistor 950 is enabled and it forces the output of the NAND gate 150 to ground voltage to prevent the false activation of the global bit line.

In one embodiment of the invention, the NAND gate 150 is implemented using the transistors 930, 932, 934, and 936. The transistor 940 is inserted between $V_{CC}$ and the drain node of the transistors 930 and 936 to prevent a short circuit of the NAND gate 150 when the reset transistor 950 is enabled. This is because when the Enable_B signal 952 is asserted to logic one, the transistor 940 is disabled and the short-circuit path of $V_{CC}$ 190 through the transistor 930 and the reset transistor 950 and to the ground node is disrupted by the transistor 940.

One of ordinary skill in the relevant art will readily appreciate that other implementations of the circuits in the register file 900 may be implemented to achieve the functionality of the register file 900 and these other implementations are applicable without affecting the workings of the invention. The circuitry associated with the LBL 2 145 is not shown in FIG. 9 for the clarity of illustration and one of ordinary skill in the relevant art will readily appreciate how to implement the circuitry associated with the LBL 2 145.

FIG. 10 illustrates a clocking circuit 1000 for the register file 900 in accordance with one embodiment of the invention. The main clock 202 and the RDEN signal 204 are connected to a delay stage 1020 that has a NAND gate 1022 and a NOR gate 1024. In one embodiment of the invention, the delay stage 1020 ensures that the Pulsed_PCH signal 916 is asserted to activate the bit line reset circuitry 910 only when the RDEN signal 204 is set to logic zero. This conserves the active power of the register file 900 as the LBL 1 140 is not discharged and recharged during a scenario where the RDEN signal 204 is valid for two or more consecutive cycles.

The output of the delay stage 1020 is connected to the NAND gate 1040. The first input of the NAND gate 1040 is connected directly to the output of the delay stage 1020. The second input of the NAND gate 1040 is connected via one or more inverters to the output of the delay stage 1020. The one or more inverters are used to set the pulse width of the Pulsed_PCH signal 916. The pulse width of the Pulsed_PCH signal 916 determines the length of time where the pre-charge transistor 132 is allowed to pre-charge the LBL 1 140. In one embodiment of the invention, the length of the pulse width is set such that the pre-charge transistor 132 has enough or sufficient time to fully pre-charge the LBL 1 140. For example, in one embodiment of the invention, if the pre-charge transistor 132 requires X number of microseconds to fully pre-charge the LBL 1 140, the pulse width of the Pulsed_PCH signal 916 is set at X number of microseconds. A suitable number of inverters that causes an equivalent gate delay of X number of microseconds is added to the clocking circuit 1000.

The number of inverters used to set the length of the pulse width of Pulsed_PCH signal 916 can be selected dynamically in one embodiment of the invention. Additional circuitry may be added to allow dynamic selection of the number of inverters in one embodiment of the invention and one of ordinary skill in the relevant art will readily appreciate how to utilize such additional circuitry in the register file 900.

The Enable_B signal 952 is generated based on the Bank_en signal 1010 and the RDEN 204 signal. The Bank_en signal 1010 is generated based on the address signals to the register file 900 in one embodiment of the invention. For example, in one embodiment of the invention, the Bank_en signal 1010 is asserted to logic one when the address signals to the register file 900 indicate that one of the entries in the bit cell segment 1 101 is selected for read access.

FIG. 11 illustrates a timing diagram 1100 of the clocking circuit 1000 in accordance with one embodiment of the invention. When any one of the entries in the bit cell segment 1 101 is selected for read access, the Bank_en signal 1010 is asserted to logic one and it asserts the Enable_B signal 952 to logic zero. This is illustrated in the Enable_B signal 952 where it switches from logic one to logic zero.

The Pulsed_PCH signal 916 is set at logic one to enable the bit line reset circuitry 910 when the LBL 1 140 is inactive. When any one of the entries in the bit cell segment 1 101 is selected for read access, a pulse is generated on the Pulsed_PCH signal 916. The logic zero pulse disables the bit line reset circuitry 910 and enables the pre-charge transistor 132 to pre-charge the LBL 1 140 for the pre-charge duration 1110.

FIG. 12 illustrates a register file 1200 in accordance with one embodiment of the invention. The register file 1200 has transistors 1210 and 1220 inserted in series with the pre-charge transistor 132 and the keeper transistor 134 respectively. The register file 1200 allows the LBL 1 140 to be pre-charged on demand and the pre-charging of the LBL 1 140 is switched off during the inactive mode of the LBL 1 140 in one embodiment of the invention. The transistor 1230 is connected with the LBL 1 140 and it resets to the LBL 1 140 to ground voltage when the PCH_EN_B signal 1235 is asserted to logic one during the inactive mode of the LBL 1 140.

During a read access of the LBL 1 140, the PCH_EN_B signal 1235 is asserted to logic zero for one or more gate delays or cycles before the PCH signal 130 is asserted to logic one to turn off the pre-charging of the LBL 1 140. This allows the LBL 1 140 to be pre-charged before the read access of the entry in the bit cell segment 1 101, i.e., before the RDWL signal of the particular entry to be accessed is asserted. The transistors 940 and 950 are controlled by the Enabled_B signal 952. Their functionality has been described earlier and shall not be repeated herein.

The operation of the on-demand pre-charging technique as illustrated in the register files 900 and 1200 are not meant to be limiting. In another embodiment of the invention, the on-demand pre-charging technique can be applied to, but not limited to, a global bit line, small signal array, cache memory, and the like. The register files 900 and 1200 provide the ability to control the bit line pre-charge voltage level by controlling the pre-charge pulse width. The bit line voltage level at the start of a word line assertion determines the bit line evaluate delay. This provides a tunable or configurable pre-charge which can be used to control the evaluate delay of the bit line. In one embodiment of the invention, the the configurability of the pre-charging levels is useful across different process corners.

For example, in one embodiment of the invention, in a process corner with stronger P-devices, the evaluation delay is slower due to the contention with the keeper transistors. As such, the pre-charge pulse width is reduced for a process corner with stronger P-devices to take advantage of the keeper transistor's ability to complete the pre-charge while speeding up the evaluation of the bit line.

FIG. 13 illustrates a clocking circuit 1300 for the register file 1200 in accordance with one embodiment of the invention. When any one of the entries in the bit cell segment 1 101 is selected for read access, the Bank_en signal 1310 is asserted to logic one. The Bank_en signal 1310, the RDEN signal 204 and the main clock 202 are connected to the delay stage 1320. The delay stage 1320 has a NAND gate 1325 and an inverter 1330. The output of the delay stage 1320 is connected with the delay stage 16 240 to generate the PCH signal 130.

The Bank_en signal 1310 and the RDEN signal 204 are also connected with the NAND gate 1310 to generate the PCH_EN_B signal 1235 and the Enable_B signal 952. The PCH_EN_B signal 1235 is used to set the desired number of gate delays or cycles for pre-charging the LBL 1 140 before any read access operation.

FIG. 14 illustrates a timing diagram 1400 of the clocking circuit 1300 in accordance with one embodiment of the invention. When any one of the entries in the bit cell segment 1 101 is selected for read access, both the RDEN signal 204 and the Bank_en signal 1310 are asserted to logic one. The NAND gate 1310 generates a logic zero and drives the Enable_B 952 and the PCH_EN_B signal 1235 to logic zero. This is illustrated by the falling edge of the Enable_B signal 952 and the PCH_EN_B signal 1235. The falling edge of the Enable_B signal 952 occurs after the falling edge of the PCH_EN_B signal 1235 due to the gate delays of the inverters.

When the PCH_EN_B signal 1235 is asserted to logic zero, the transistor 1230 is disabled and the LBL 1 140 is not discharged to ground. The pre-charge transistor 130 and the keeper transistor 134 are enabled and it pre-charges the LBL 1 140 to $V_{CC}$ 190. The pre-charging of the LBL 1 140 continues until the PCH signal 130 is asserted to logic high to switch off the pre-charging during the read access of the entry in the bit cell segment 1 101. The pre-charging of the LBL 1 140 is illustrated by the pre-charging duration 1420.

Embodiments of the invention are not limiting to N-type domino register files. The techniques discussed can be applied to a P-type domino with appropriate logic inversion in one embodiment of the invention. For example, in one embodiment of the invention, a P-type domino can be implemented by replacing each N-type device with a P-type device and vice-versa. One of ordinary skill in the relevant art will readily how to modify the circuitry required for a P-type domino register file and the modifications shall not be described herein. The NAND gate 150 can be replaced with either a NOR gate or an inverter (INV) gate in another embodiment of the invention.

FIG. 15 illustrates a system 1500 to implement the methods disclosed herein in accordance with one embodiment of the invention. The system 1500 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 1500 used to implement the methods disclosed herein may be a system on a chip (SOC) system.

The processor 1510 has a processing core 1512 to execute instructions of the system 1500. The processing core 1512 includes, but is not limited to, pre-fetch logic to fetch instructions, decode logic to decode the instructions, execution logic to execute instructions and the like. The processor 1510 has a cache memory 1516 to cache instructions and/or data of the system 1500. In another embodiment of the invention, the cache memory 1516 includes, but is not limited to, level one, level two and level three, cache memory or any other configuration of the cache memory within the processor 1510. In one embodiment of the invention, the processor 1510 has one or more of the register files 400, 700, 900, and 1200.

The memory control hub (MCH) 1514 performs functions that enable the processor 1510 to access and communicate with a memory 1530 that includes a volatile memory 1532 and/or a non-volatile memory 1534. The volatile memory 1532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1534 includes, but is not limited to, NAND flash memory, phase change memory (PCM), read only memory (ROM), electrically erasable programmable read only memory (EEPROM), or any other type of non-volatile memory device.

The memory 1530 stores information and instructions to be executed by the processor 1510. The memory 1530 may also stores temporary variables or other intermediate information while the processor 1510 is executing instructions. The chipset 1520 connects with the processor 1510 via Point-to-Point (PtP) interfaces 1517 and 1522. The chipset 1520 enables the processor 1510 to connect to other modules in the system 1500. In one embodiment of the invention, the interfaces 1517 and 1522 operate in accordance with a PtP communication protocol such as the Intel® QuickPath Interconnect (QPI) or the like. The chipset 1520 connects to a display device 1540 that includes, but is not limited to, liquid crystal display (LCD), cathode ray tube (CRT) display, or any other form of visual display device.

In addition, the chipset 1520 connects to one or more buses 1550 and 1555 that interconnect the various modules 1574, 1560, 1562, 1564, and 1566. Buses 1550 and 1555 may be interconnected together via a bus bridge 1572 if there is a mismatch in bus speed or communication protocol. The chipset 1520 couples with, but is not limited to, a non-volatile memory 1560, a mass storage device(s) 1562, a keyboard/mouse 1564 and a network interface 1566. The mass storage device 1562 includes, but is not limited to, a solid state drive, a hard disk drive, an universal serial bus flash memory drive, or any other form of computer data storage medium. The network interface 1566 is implemented using any type of well known network interface standard including, but not limited to, an Ethernet interface, a universal serial bus (USB) interface, a Peripheral Component Interconnect (PCI) Express interface, a wireless interface and/or any other suitable type of interface. The wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 15 are depicted as separate blocks within the system 1500, the functions performed by some of these blocks may be integrated within a single semiconductor circuit or may be implemented using two or more separate integrated circuits. For example, although the cache memory 1516 is depicted as a separate block within the processor 1510, the cache memory 1516 can be incorporated into the processor core 1512 respectively. The system 1500 may include more than one processor/processing core in another embodiment of the invention.

The methods disclosed herein can be implemented in hardware, software, firmware, or any other combination thereof. Although examples of the embodiments of the disclosed subject matter are described, one of ordinary skill in the relevant art will readily appreciate that many other methods of implementing the disclosed subject matter may alternatively be used. In the preceding description, various aspects of the disclosed subject matter have been described. For purposes of explanation, specific numbers, systems and configurations were set forth in order to provide a thorough understanding of the subject matter. However, it is apparent to one skilled in the relevant art having the benefit of this disclosure that the subject matter may be practiced without the specific details. In other instances, well-known features, components, or modules were omitted, simplified, combined, or split in order not to obscure the disclosed subject matter.

The term "is operable" used herein means that the device, system, protocol etc, is able to operate or is adapted to operate for its desired functionality when the device or system is in off-powered state. Various embodiments of the disclosed subject matter may be implemented in hardware, firmware, software, or combination thereof, and may be described by reference to or in conjunction with program code, such as instructions, functions, procedures, data structures, logic, application programs, design representations or formats for simulation, emulation, and fabrication of a design, which when accessed by a machine results in the machine performing tasks, defining abstract data types or low-level hardware contexts, or producing a result.

The techniques shown in the figures can be implemented using code and data stored and executed on one or more computing devices such as general purpose computers or computing devices. Such computing devices store and communicate (internally and with other computing devices over a network) code and data using machine-readable media, such as machine readable storage media (e.g., magnetic disks; optical disks; random access memory; read only memory; flash memory devices; phase-change memory) and machine readable communication media (e.g., electrical, optical, acoustical or other form of propagated signals—such as carrier waves, infrared signals, digital signals, etc.).

While the disclosed subject matter has been described with reference to illustrative embodiments, this description is not intended to be construed in a limiting sense. Various modifications of the illustrative embodiments, as well as other embodiments of the subject matter, which are apparent to persons skilled in the art to which the disclosed subject matter pertains are deemed to lie within the scope of the disclosed subject matter.

What is claimed is:

1. An apparatus, comprising:
a memory device including a segment of multiple bit cells;
a local bitline to receive an output of the segment;
first pre-charge circuitry to pre-charge the output of the segment; and
control circuitry to enable the first pre-charge circuitry for a predetermined period of time between selection of the segment for a read access operation and the read access operation, based on selection of the segment for the read access operation, and to disable the first pre-charge circuitry during the read access operation and until a subsequent selection of the segment for a read access operation.

2. The apparatus of claim 1, further including:
keeper circuitry to maintain a logic state of the local bitline; and
keeper interrupt circuitry to disable the keeper circuitry;
wherein the control circuitry is configured to disable the keeper interrupt circuitry based on the selection of the segment for the read access operation, and to enable the keeper interrupt circuitry after the read access operation and until a subsequent selection of the segment for a read access operation.

3. The apparatus of claim 2, wherein the control circuitry is further configured to disable the keeper interrupt circuitry prior to enablement of the first pre-charge circuitry.

4. The apparatus of claim 1, further including:
output circuitry to provide a logic state of the local bitline to a global bitline;
first reset circuitry to discharge the local bitline; and
second reset circuitry to discharge an output of the output circuitry;
wherein the control circuitry is configured to enable the output circuitry and disable the first and second reset circuitry based on the selection of the segment for the read access operation, and to disable the output circuitry and enable the first and second reset circuitry after the read access operation and until a subsequent selection of the segment for a read access operation.

5. The apparatus of claim 4, wherein the control circuitry is further configured to enable the output circuitry and disable the first and second reset circuitry prior to enablement of the first pre-charge circuitry.

6. The apparatus of claim 4, further including:
keeper circuitry to maintain a logic state of the local bitline; and
keeper interrupt circuitry to disable the keeper circuitry;
wherein the control circuitry is further configured to disable the keeper interrupt circuitry based on the selection of the segment for the read access operation, and to enable the keeper interrupt circuitry after the read access operation and until a subsequent selection of the segment for a read access operation.

7. The apparatus of claim 1, wherein the control circuitry is configurable to control a voltage to which the first pre-charge circuitry is to pre-charge the output of the segment.

8. The apparatus of claim 1, wherein the control circuitry is configurable to control the predetermined period of a time for which the first pre-charge circuitry is enabled.

9. The apparatus of claim 8, wherein the control circuitry includes dynamically selectable inverters to control the predetermined period of time for which the first pre-charge circuitry is enabled.

10. The apparatus of claim 1, further including:
a gate circuit to selectively provide the output of the segment to the local bitline based on a bitline control.

11. The apparatus of claim 10, further including:
second pre-charge circuitry to pre-charge the local bitline, wherein the first pre-charge circuitry is configured to reduce charge sharing between the bit cells of the segment and the local bitline;
wherein the control circuitry is configured to disable the second pre-charge circuitry during the read access operation, and to enable the second pre-charge circuitry after the read access operation and until a subsequent read access operation directed to a bit cell of the segment.

12. The apparatus of claim 11, wherein the control circuitry is further configured to enable the second pre-charge circuitry to pre-charge the local bitline to a supply voltage and to enable the first pre-charge circuitry to pre-charge the output of the segment to a voltage that is less than the supply voltage.

13. The apparatus of claim 12, wherein the first pre-charge circuitry includes:
first and second devices to provide a path between the supply voltage and the output of the segment;
wherein the control circuitry is further configured to enable the first device between read access operations directed to the segment and disable the first device during read access operations directed to the segment, and to enable the second device based on a decoded address associated with the segment and a pre-determined number of delay periods to pre-charge the output of the segment to the voltage that is less than the supply voltage.

14. The apparatus of claim 13, wherein the memory device includes the second pre-charge circuitry.

15. The apparatus of claim 14, wherein the memory device is configured as a register file.

16. The apparatus of claim 10, wherein:
the segment is configured to provide a logic state from one of the bit cells to the output of the segment based an active one of multiple static read wordlines that are asynchronous with a clock; and
the gate circuit is configured to provide the logic state from the output of the segment to the local bitline based on a corresponding one of multiple bitline controls that are synchronous with the clock.

17. The apparatus of claim 16, further including:
keeper circuitry to maintain a logic state of the local bitline; and
keeper interrupt circuitry to disable the keeper circuitry;
wherein the control circuitry is configured to disable the keeper interrupt circuitry based on the selection of the segment for the read access operation, and to enable the keeper interrupt circuitry after the read access operation and until a subsequent selection of the segment for a read access operation.

18. The apparatus of claim 16, further including:
output circuitry to provide a logic state of the local bitline to a global bitline;
first reset circuitry to discharge the local bitline; and
second reset circuitry to discharge an output of the output circuitry;
wherein the control circuitry is further configured to enable the output circuitry and disable the first and second reset circuitry based on the selection of the segment for the read access operation, and to disable the output circuitry and enable the first and second reset circuitry after the read access operation and until a subsequent selection of the segment for a read access operation.

19. The apparatus of claim 18, further including:
keeper circuitry to maintain a logic state of the local bitline; and
keeper interrupt circuitry to disable the keeper circuitry;
wherein the control circuitry is further configured to disable the keeper interrupt circuitry based on the selection of the segment for the read access operations and to enable the keeper interrupt circuitry after the read access operation and until a subsequent selection of the segment for a read access operation.

* * * * *

UNITED STATES PATENT AND TRADEMARK OFFICE
CERTIFICATE OF CORRECTION

| | | |
|---|---|---|
| PATENT NO. | : 8,767,492 B2 | Page 1 of 1 |
| APPLICATION NO. | : 12/776264 | |
| DATED | : July 1, 2014 | |
| INVENTOR(S) | : Eric Kwesi Donkoh | |

It is certified that error appears in the above-identified patent and that said Letters Patent is hereby corrected as shown below:

On the Title Page, in Item (54) and in the Specification, in column 1, line 5, "Title", Delete "BITELINE" and insert -- BITLINE --, therefor.

IN THE CLAIMS:

In column 13, line 15, In Claim 8, delete "of a" and insert -- of --, therefor.

Signed and Sealed this
Thirtieth Day of December, 2014

Michelle K. Lee
*Deputy Director of the United States Patent and Trademark Office*